United States Patent
Aleksić et al.

(10) Patent No.: US 9,564,912 B2
(45) Date of Patent: Feb. 7, 2017

(54) INTEGRATED CIRCUIT HAVING A CLOCK DESKEW CIRCUIT THAT INCLUDES AN INJECTION-LOCKED OSCILLATOR

(71) Applicant: Rambus Inc., Sunnyvale, CA (US)

(72) Inventors: Marko Aleksić, Mountain View, CA (US); Brian S. Leibowitz, San Francisco, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 14/990,443

(22) Filed: Jan. 7, 2016

(65) Prior Publication Data

US 2016/0226504 A1  Aug. 4, 2016

Related U.S. Application Data

(63) Continuation of application No. 14/444,669, filed on Jul. 28, 2014, now Pat. No. 9,264,055, which is a continuation of application No. 13/353,851, filed on Jan. 19, 2012, now Pat. No. 8,804,397.

(60) Provisional application No. 61/448,885, filed on Mar. 3, 2011.

(51) Int. Cl.
  *G11C 11/00* (2006.01)
  *H03L 7/099* (2006.01)
  *H03L 7/24* (2006.01)

(52) U.S. Cl.
  CPC ............ *H03L 7/24* (2013.01); *H03L 7/099* (2013.01); *H03L 7/0995* (2013.01)

(58) Field of Classification Search
  CPC .......... H03L 7/099; H03L 7/24; H03L 7/0995
  See application file for complete search history.

(56) References Cited

U.S. PATENT DOCUMENTS

| | | | | |
|---|---|---|---|---|
| 6,256,361 B1 * | 7/2001 | Mozetic | .................... | H03L 7/24 |
| | | | | 327/159 |
| 6,369,659 B1 * | 4/2002 | Delzer | .................... | H03L 7/083 |
| | | | | 331/10 |
| 6,608,875 B1 * | 8/2003 | Wolaver | .................... | H03L 7/24 |
| | | | | 331/25 |
| 6,838,919 B1 | 1/2005 | Kaviani | | |
| 7,443,250 B2 | 10/2008 | Seethamraju et al. | | |
| 7,855,933 B2 | 12/2010 | Song et al. | | |
| 8,036,300 B2 | 10/2011 | Evans et al. | | |

(Continued)

OTHER PUBLICATIONS

Adler, Robert, "A Study of Locking Phenomena in Oscillators." Jun. 1946, Proceedings of the I.R.E. and Waves and Electrons, p. 351-357. 7 pages.

(Continued)

*Primary Examiner* — Toan Le
(74) *Attorney, Agent, or Firm* — Park, Vaughan, Fleming & Dowler LLP; Lexman Sahasrabuddhe

(57) ABSTRACT

Methods and apparatuses featuring an injection-locked oscillator (ILO) are described. In some embodiments, an ILO can have multiple injection points and a free-running frequency that is capable of being adjusted based on a control signal. In some embodiments, each injection point of an ILO can correspond to a phase tuning range. In some embodiments, a circuit can include circuitry to detect a phase boundary between two adjacent phase tuning ranges. In some embodiments, a circuit can use the detected phase boundary to switch between the two adjacent phase tuning ranges.

20 Claims, 9 Drawing Sheets

(56) References Cited

U.S. PATENT DOCUMENTS

| | | |
|---|---|---|
| 8,804,397 B2 | 8/2014 | Aleksic et al. |
| 2007/0058768 A1 | 3/2007 | Werner |
| 2009/0167441 A1 | 7/2009 | Song et al. |
| 2009/0175116 A1 | 7/2009 | Song et al. |

OTHER PUBLICATIONS

Carusone, Tony Chan, "Injection-Locking for High-Speed Wireline Communication," University of Toronto, Apr. 15, 2010. 14 pages.

Casper et al., "A 20Gb/s Forwarded Clock Transceiver in 90nm CMOS," 4.6, ISSCC 2006 Session 4. 10 pages.

Farjad-Rad, Ramin et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.

Hossain, et al., "5-10 Gb/s 70 mW Burst Mode AC Coupled Receiver in 90-nm CMOS," IEEE Journal of Solid-State Circuits, vol. 45, No. 3, Mar. 2010, p. 524-537. 14 pages.

Hossain, Masum et al., "A 6.8mW 7.4Gb/s Clock-Forwarded Receiver with up to 300MHz Jitter Tracking in 65nm CMOS," ISSCC 2010, Session 8, High-Speed Wireline Transceivers 8.2, p. 158-160. 3 pages.

Hossain, Masum et al., "CMOS Oscillators for Clock Distribution and Injection-Locked Deskew," IEEE Journal of Solid-State Circuits, vol. 44, No. 8, pp. 2138-2153, Aug. 2009. 16 pages.

Hu et al., "A 0.6mW/Gbps, 6.4-8.0Gbps Serial Link Receiver Using Local Injection-Locked Ring Oscillators in 90nm CMOS," 2009 Symposium on VLSI Circuits Digest of Technical Papers. 2 pages.

Hu, Kangmin et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.

Jaussi et al., "A 20Gb/s Embedded Clock Transceiver in 90nm CMOS," 18.8, ISSCC 2006 Session 18. 10 pages.

Lai et al., "Capturing Oscillator Injection Locking via Nonlinear Phase-Domain Macromodels," IEEE Transactions on Microwave Theory and Techniques, vol. 52, No. 9, Sep. 2004, p. 2251-2261. 11 pages.

Lee, Jri et al., "Paper 5.2; Subharmonically Injection-Locked PLLs for Ultra-Low-Noise Clock Generation," Slides, 2009 IEEE International Solid-State Circuits Conference. 32 pages.

Lee, Jri et al., "Subharmonically injection-Locked PLLs for Ultra-Low-Noise Clock Generation," ISSCC 2009, Session 5, 5.2, pp. 91-93. 3 pages.

Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, p. 1297-1305. 9 pages.

Mahony et al., "A 27Gb/s Forwarded-Clock I/O Receiver Using an Injection-Locked LC-DCO in 45nm CMOS," 25.1, ISSCC 2008 Session 25, p. 452-453, 627, 3 pages.

Mirzaei, Ahmad et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.

Ng et al. "A Second-Order Semidigital Clock Recovery Circuit Based on Injection Locking", IEEE Journal of Solid-State Circuits, vol. 38 No. 12, Dec. 2003, pp. 2101-2110, plus corresponding ISSCC 2003 Session 4 paper 4.3. 18 pages.

O'Mahony et al., "Paper 25.1: A 27Gb/s Forwarded-Clock I/O Receiver using an Injection-Locked LC-DCO in 45nm CMOS," IEEE International Solid-State Circuits 2008. 39 pages.

O'Mahony, Frank et al. "A Programmable Phase Rotator based on Time-Modulated Injection-Locking" 2010 IEEE Symposium on VLSI Circuits (VLSIC), Honolulu, HI, Jun. 16-18, 2010, pp. 45-46. 2 pages.

Paciorek, L.J., "Injection Locking of Oscillators," Nov. 1965, Proceedings of the IEEE, vol. 53, No. 11, p. 1723-1728. 6 pages.

Rategh, H.R., et al., "Superharmonic Injection-Locked Frequency Dividers," IEEE Journal of Solid-State Circuits, 34(6): 813-821 (Jun. 1999). 9 pages.

Razavi, Behzad, "A Study of Injection Locking and Pulling in Oscillators," IEEE Journal of Solid-State Circuits, vol. 39, No. 9, Sep. 2004, p. 1415-1424. 10 pages.

Shekhar, Sudip et al., "Strong injection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.

Vanassche, et al., "On the Difference between Two Widely Publicized Methods for Analyzing Oscillator Phase Behavior," 2002, IEEE, p. 229-233. 5 pages.

Zhang, Lin et al., "Active Deskew in Injection-Locked Clocking" IEEE 2008 Custom intergrated Circuits Conference (CICC), Sep. 21-24, 2008, pp. 567-570. 4 pages.

Zhang, Lin et al., "Injection-Locked Clocking: A New GHz Clock Distribution Scheme," IEEE 2006 Custom Integrated Circuits Conference (CICC), pp. 785-788. 4 pages.

\* cited by examiner

MEMORY CONTROLLER
800

ILO-BASED CLOCK
DESKEW CIRCUIT
802

MEMORY MODULE
804

INTEGRATED CIRCUIT HAVING A CLOCK DESKEW CIRCUIT THAT INCLUDES AN INJECTION-LOCKED OSCILLATOR

RELATED APPLICATION

This application is a continuation of, and claims priority to, U.S. application Ser. No. 14/444,669, having the same title and inventors, filed 28 Jul. 2014, the contents of which are herein incorporated by reference in their entirety for all purposes. U.S. application Ser. No. 14/444,669 is a continuation of, and claims priority to, U.S. application Ser. No. 13/353,851 (U.S. Pat. No. 8,804,397), having the same title and inventors, filed 19 Jan. 2012, the contents of which are herein incorporated by reference in their entirety for all purposes. U.S. application Ser. No. 13/353,851 (U.S. Pat. No. 8,804,397) is a non-provisional of, and claims priority to, U.S. Provisional Application No. 61/448,885, having the same title and inventors, filed 3 Mar. 2011, the contents of which are incorporated herein by reference in their entirety for all purposes.

FIELD

This disclosure generally relates to electronic circuits. This disclosure generally relates to integrated circuit devices that include an injection-locked oscillator (ILO) circuit.

BACKGROUND

Some applications (e.g., high-performance memory systems) use circuits for adjusting the phase of a clock signal. An injection-locked oscillator (ILO) can be used in a phase adjustment circuit that adjusts the phase of a clock signal with respect to a reference phase. Some ILO-based phase adjustment circuits add a significant amount of complex circuitry to adjust the phase of the output clock signal.

DETAILED DESCRIPTION

Embodiments presented in this disclosure are directed to methods and apparatuses featuring a circuit that uses an ILO to adjust the phase of a clock signal. In some embodiments, the ILO locks onto an input clock signal if the frequency of the input clock signal is relatively close to the free-running frequency of the ILO, or relatively close to a sub-harmonic or a super-harmonic of the free-running frequency of the ILO. In some embodiments, the phase of an output clock signal can be adjusted by varying the difference between an injection clock signal frequency (which can be the same as the input clock signal frequency) and the free-running frequency of the ILO. Specifically, in some embodiments, the ILO-based clock deskew circuit can be calibrated so that a free-running frequency of the ILO can be established for a target phase value, thereby enabling the ILO-based clock deskew circuit to output the clock signal with the target phase by tuning the ILO to the determined free-running frequency. In some embodiments, the ILO-based clock deskew circuit can include detection circuitry that is capable of detecting a phase boundary between adjacent phase tuning ranges. In this disclosure, unless otherwise stated, the phrase "based on" means "based solely or partly on."

Embodiments described herein include, but are not limited to, ILOs that are based on a tank circuit (i.e., an inductor/capacitor oscillator) or a ring oscillator, with one or more nodes for receiving an input clock signal, and one or more nodes for outputting an output clock signal.

Figure 1:
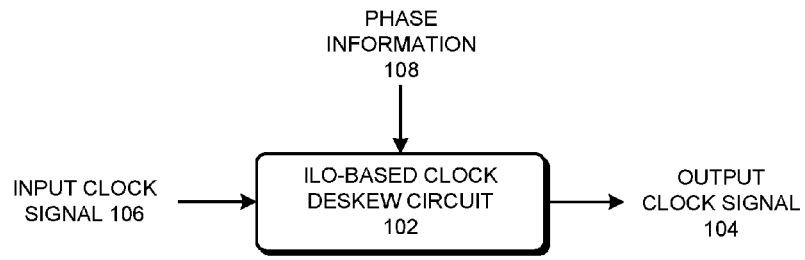
FIG. 1 illustrates an ILO-based clock deskew circuit in accordance with some embodiments described in this disclosure.

FIG. 1 illustrates an ILO-based clock deskew circuit in accordance with some embodiments described in this disclosure.

In some embodiments, ILO-based clock deskew circuit 102 outputs output clock signal 104 based on input clock signal 106 and phase information 108. Specifically, in some embodiments, the frequency of output clock signal 104 can be based on the frequency of input clock signal 106 (e.g., they can be substantially equal), and ILO-based clock deskew circuit 102 can be calibrated so that the phase of output clock signal 104 can be set to a desired value by providing appropriate phase information 108 to ILO-based clock deskew circuit 102. The methods and apparatuses described in this disclosure are generally applicable to any integrated circuit device (or system) that includes one or more ILO-based clock deskew circuits.

Figure 2:
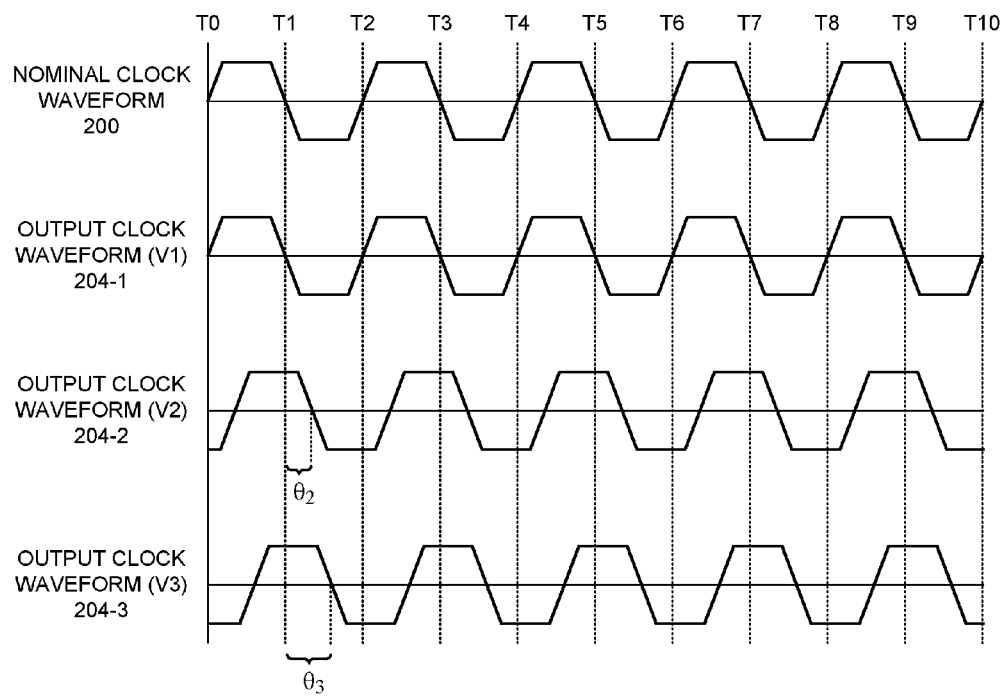
FIG. 2 illustrates signal waveforms associated with an ILO-based clock deskew circuit in accordance with some embodiments described in this disclosure.

FIG. 2 illustrates signal waveforms associated with an ILO-based clock deskew circuit in accordance with some embodiments described in this disclosure.

In some embodiments, nominal clock waveform 200 can correspond to a nominal clock signal, which may or may not be the input clock signal of the ILO-based clock deskew circuit. Time instances T0-T10 correspond to edge transitions of nominal clock waveform 200. Output clock waveforms 204-1, 204-2, and 204-3 may correspond to the output clock signal (e.g., output clock signal 104) of the ILO-based clock deskew circuit (e.g., ILO-based clock deskew circuit 102) for different phase information values. The frequency of output clock waveform 204 can be substantially equal to the frequency of nominal clock waveform 200. In some embodiments, the ILO-based clock deskew circuit can be used to adjust the phase of the output clock signal with respect to the nominal clock signal based on the phase information that is provided to the ILO-based clock deskew circuit.

For example, as shown in FIG. 2, if the phase information value is V1, the ILO-based clock deskew circuit may produce output clock waveform 204-1, which has a zero phase difference with respect to nominal clock waveform 200. Similarly, if the phase information value is V2 or V3, the ILO-based clock deskew circuit may produce output clock waveforms 204-2 or 204-3, respectively, having phase differences $\theta_2$ or $\theta_3$, respectively, with respect to nominal clock waveform 200.

Figure 3A:
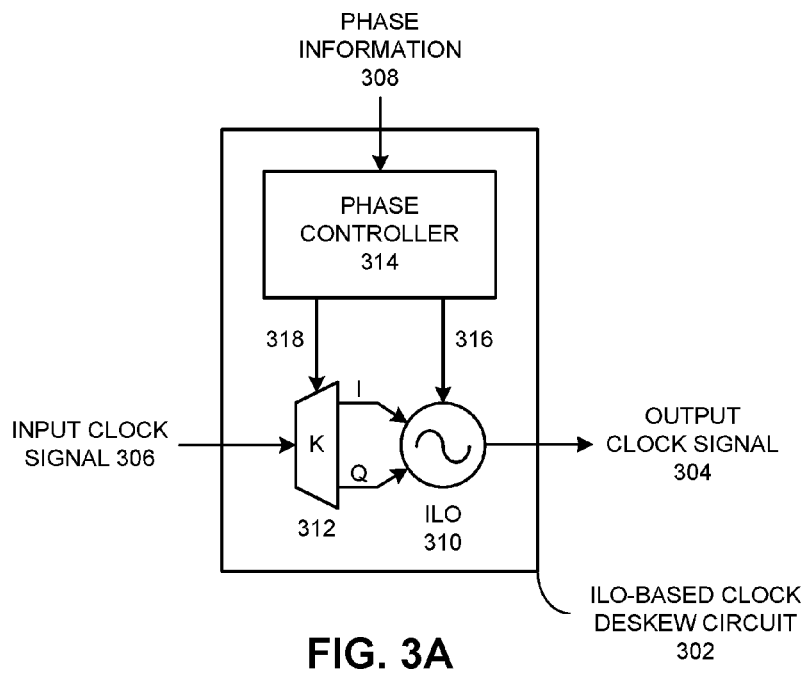
FIG. 3A illustrates an ILO-based clock deskew circuit in accordance with some embodiments described in this disclosure.

FIG. 3A illustrates an ILO-based clock deskew circuit in accordance with some embodiments described in this disclosure.

In some embodiments, ILO-based clock deskew circuit 302 can include phase controller 314, demultiplexer 312, and ILO 310. Demultiplexer 312 can receive input clock signal 306 and inject an injection clock signal into one of multiple injection points of ILO 310 based on injection point select signal 318. For example, demultiplexer 312 can inject, based on injection point select signal 318, the injection clock signal into an in-phase injection point (denoted by "I") or a quadrature-phase injection point (denoted by "Q"). Demultiplexer 312 can also adjust the amplitude of the injection clock signal (shown in FIG. 3A as gain "K"). ILO 310 can receive free-running frequency control signal 316 which can be used to vary the free-running frequency of ILO 310. In some embodiments, phase controller 314 can receive phase information 308 and generate injection point select signal 318 and free-running frequency control signal 316.

Figure 3B:
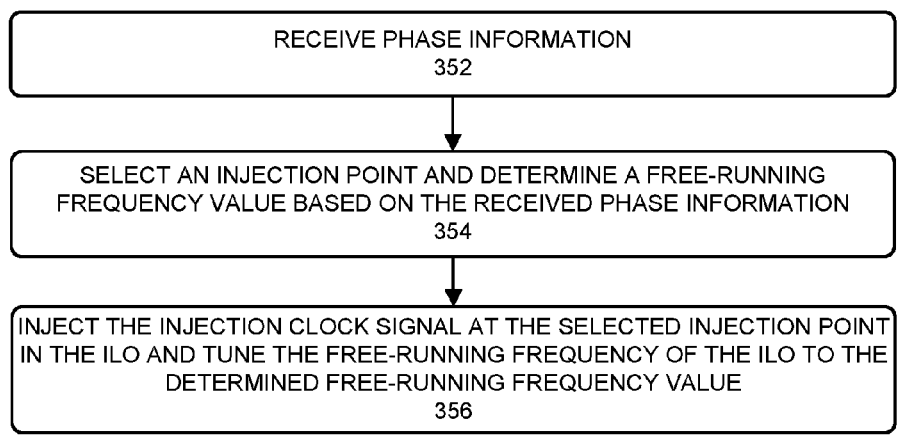
FIG. 3B presents a flowchart that illustrates a process for modifying the phase of a clock signal using an ILO-based clock deskew circuit in accordance with some embodiments described in this disclosure.

FIG. 3B presents a flowchart that illustrates a process for modifying the phase of a clock signal using an ILO-based clock deskew circuit, e.g., ILO-based clock deskew circuit 302, in accordance with some embodiments described in this disclosure.

In some embodiments, an ILO-based clock deskew circuit can receive phase information (operation 352). The phase information can indicate a target phase setting for the output clock signal of ILO. Next, the ILO-based clock deskew circuit can select an injection point and determine a free-running frequency value based on the received phase information (operation 354). The ILO-based clock deskew circuit can then inject the injection clock signal at the selected injection point in the ILO and tune the free-running frequency of the ILO to the determined free-running frequency value (operation 356), thereby causing the output clock signal of the ILO to have the target phase.

Specifically, in some embodiments, phase controller 314 can generate injection point select signal 318 and free-running frequency control signal 316 based on phase information 308. Injection point select signal 318 can be provided as a control signal to demultiplexer 312 in order to inject the injection clock signal at a particular injection point in ILO 310, and the free-running frequency control signal 316 can be provided to ILO 310 to tune the free-running frequency of ILO 310 to a desired value. In this manner, ILO-based clock deskew circuit 302 can modify the phase of output clock signal 304 based on phase information 308.

Figure 3C:
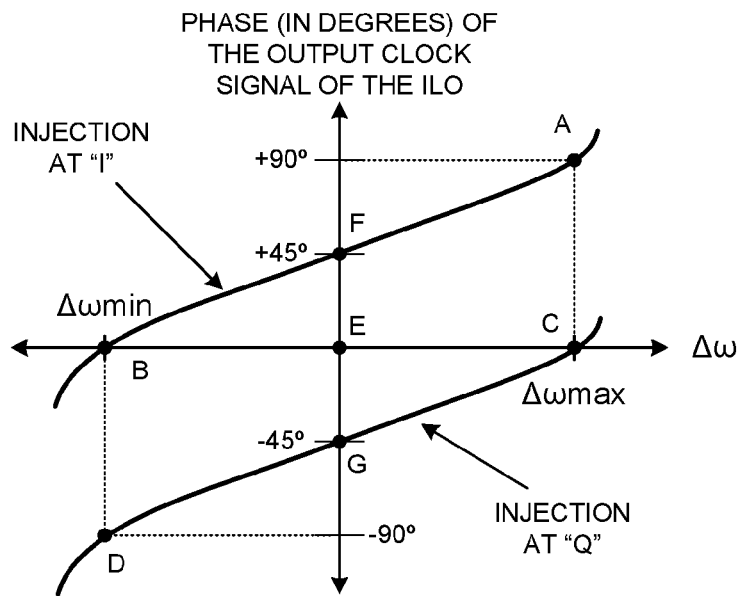
FIG. 3C illustrates phase curves for an ILO-based clock deskew circuit in accordance with some embodiments described in this disclosure.

FIG. 3C illustrates phase curves for an ILO-based clock deskew circuit in accordance with some embodiments described in this disclosure.

The X-axis corresponds to the frequency difference (denoted by "$\Delta\omega$") between the free-running frequency of the ILO and the frequency of the injection clock signal, if the injection frequency (which can be the same as the frequency of the input clock signal) is close to the free-running frequency. If the injection frequency is much greater or smaller than the free-running frequency in order to inject the oscillator at a harmonic or sub-harmonic of the ILO, then $\Delta\omega$ represents the difference between the relevant harmonic or sub-harmonic frequency and the injection frequency. The Y-axis corresponds to the phase (in degrees) of the output clock signal of the ILO. When the injection clock signal is injected in the in-phase injection point, the ILO operates along the top curve (between points "A" and "B"). When the injection clock signal is injected in the quadrature-phase injection point, the ILO operates along the bottom curve (between points "C" and "D").

The phase of the output clock signal is +90° at point "A," zero at points "B" and "C," and −90° at point "D." Frequency difference value $\Delta\omega$min corresponds to points "B" and "D," and frequency difference value $\Delta\omega$max corresponds to points "A" and "C." The ILO-based clock deskew circuit can switch between in-phase and quadrature-phase injection and frequency differences $\Delta\omega$min and $\Delta\omega$max to switch between operation at points "B" and "C" which have the same output clock phase. Note that each injection point can be viewed as being associated with a phase tuning range. For example, in FIG. 3C, the in-phase injection point may be associated with a phase tuning range between +90° and 0°, and the quadrature-phase injection point may be associated with a phase tuning range between 0° and −90°.

The ILO-based clock deskew circuit can vary the phase from +90° to −90° as follows. A phase of +90° can be achieved by operating the ILO at point "A," i.e., by using in-phase injection and a frequency difference equal to $\Delta\omega$max. The phase can be decreased from +90° to 0° by moving the operating point of the ILO from point "A" to point "B" along the top curve, e.g., by using in-phase injection and decreasing the frequency difference from $\Delta\omega$max to $\Delta\omega$min.

Once point "B" is reached on the top curve, the ILO-based clock deskew circuit can switch to point "C" in the bottom curve, e.g., by operating the ILO in quadrature-phase injection and by changing the frequency difference to $\Delta\omega$max. The phase can then be decreased from 0° to −90° by moving the operating point of the ILO from point "C" to point "D" along the bottom curve, e.g., by using quadrature-phase injection and decreasing the frequency difference from $\Delta\omega$max to $\Delta\omega$min.

In some embodiments, the ILO-based clock deskew circuit can adjust the phase over the full 360° range by inverting either the injection clock signal or the output clock signal of the ILO in addition to performing the ±90° phase adjustment as explained above.

In some embodiments, for a target phase value, the ILO-based clock deskew circuit can determine an appropriate injection point and a frequency difference value from the phase curves that will cause the phase of the output clock signal of the ILO to be equal to the target phase value. Specifically, if frequency difference values Δωmin and Δωmax are determined (e.g., during calibration), the ILO-based clock deskew circuit can switch between the different injection points at the appropriate frequency difference values. In some embodiments, the ILO-based clock deskew circuit can be part of a feedback loop (e.g., a clock and data recovery, or CDR, loop) that adjusts the frequency difference value in response to a feedback signal that is sensitive to the output clock phase. In some embodiments, the ILO-based clock deskew circuit can use linear interpolation, piecewise linear interpolation, or other interpolation methods to determine the frequency difference value Δω that corresponds to a given phase value.

For example, in some embodiments, the phase of the ILO output signal for injection at point p can be determined using the following expression: $\theta = \theta_{0,p} + \sin^{-1}(A \cdot \Delta\omega/K)$, where $\theta$ is the phase of the ILO output signal, A is an ILO-specific constant, Δω is the difference between the frequency of the injection clock signal and the free-running frequency of the ILO, K is the injection strength relative to a nominal ILO signal, and $\theta_{0,p}$ is the nominal phase with Δω=0 for injection at point p and injection strength K.

Some embodiments described in this disclosure provide methods and apparatuses for calibrating an ILO-based clock deskew circuit by determining frequency difference values (e.g., Δωmin and Δωmax) that correspond to the phase boundaries between adjacent phase tuning ranges associated with injection points.

Figure 4A:
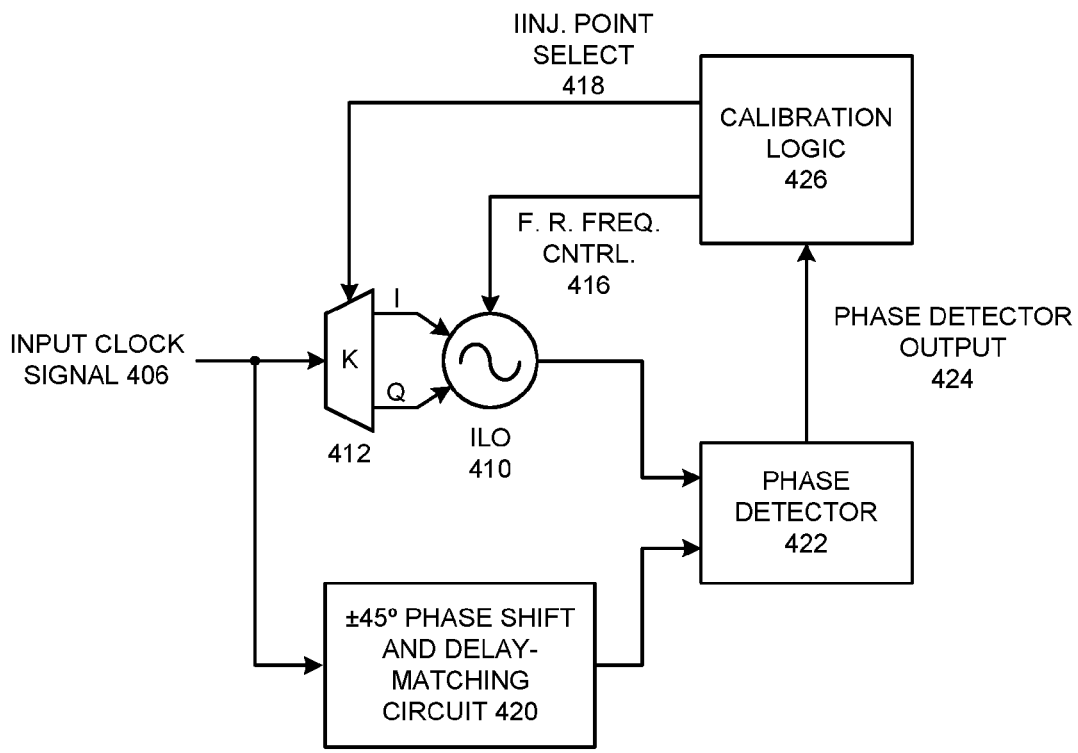
FIG. 4A illustrates how an ILO-based clock deskew circuit can be calibrated in accordance with some embodiments described in this disclosure.

FIG. 4A illustrates how an ILO-based clock deskew circuit can be calibrated in accordance with some embodiments described in this disclosure.

In some embodiments, demultiplexer 412 can generate an injection signal based on input clock signal 406, and inject the injection signal into one of multiple injection points in ILO 410 based on an injection point select signal. For example, demultiplexer 412 can inject the injection signal into an in-phase or quadrature-phase injection point of ILO 410 based on injection point select signal 418. ILO 410 can receive free-running frequency control signal 416 which can be used to tune the free-running frequency of ILO 410. Input clock signal 406 can also be provided as input to ±45° phase shift and delay-matching circuit 420 which introduces, into input clock signal 406, a ±45° phase shift and a delay that matches the delay of the active path, e.g., the delay through demultiplexer 412 and ILO 410. The outputs of ILO 410 and ±45° phase shift and delay-matching circuit 420 can be provided as inputs to phase detector 422. Phase detector 422 can generate phase detector output 424, which can be indicative of the phase difference between the two inputs, namely, the phase difference between the output of ILO 410 and the output of ±45° phase shift and delay-matching circuit 420.

Calibration logic 426 can be used to calibrate the ILO-based clock deskew circuit by determining frequency difference values (e.g., Δωmin and Δωmax) that correspond to the phase boundaries associated with the injection points. In some embodiments, calibration logic 426 can receive phase detector output 424 and generate injection point select signal 418 and free-running frequency control signal 416. Calibration logic 426 can sweep the free-running frequency control signal 416 to determine the free-running frequency signal values that correspond to the switchover point between in-phase and quadrature-phase injection. Specifically, in some embodiments, calibration logic 426 can sweep the free-running frequency control signal 416 until the phase of the output of ILO 410 is substantially equal to the phase of the output of ±45° phase shift and delay-matching circuit 420. When Δω=0, the phase of the output of ILO 410 is equal to +45° for in-phase injection (point "F") and −45° for quadrature-phase injection (point "G"). The phase of the output of ±45° phase shift and delay-matching circuit 420 is equal to 0° (point "E"), which is −45° with respect to point "F," and +45° with respect to point "G." The phase at each of the switchover points "B" and "C" is equal to the phase at point "E" which corresponds to the phase of the output of ±45° phase shift and delay-matching circuit 420. In this manner, calibration logic 426 can determine frequency difference values (e.g., Δωmin and Δωmax) that correspond to the phase boundaries associated with the injection points. In some embodiments, calibration logic 426 can be part of a phase controller, e.g., phase controller 314 shown in FIG. 3A.

Figure 4B:
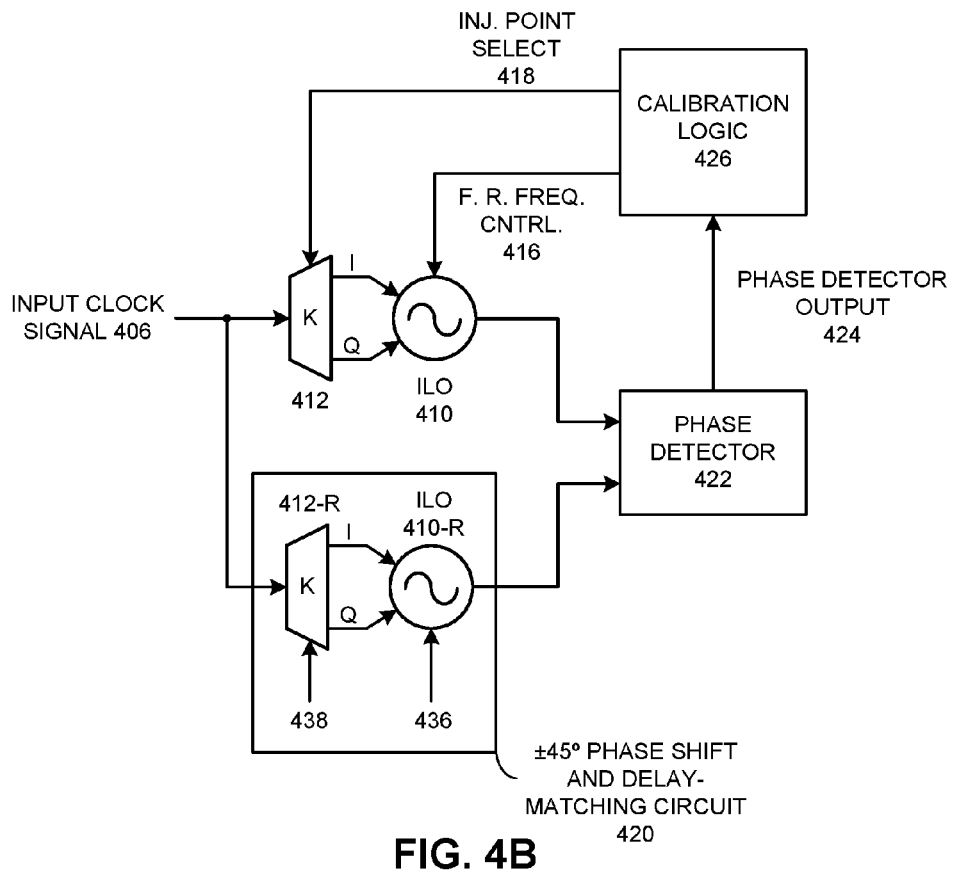
FIG. 4B illustrates an embodiment of a ±45° phase shift and ILO delay circuit in accordance with some embodiments described in this disclosure.

FIG. 4B illustrates an embodiment of a ±45° phase shift and delay-matching circuit in accordance with some embodiments described in this disclosure.

In some embodiments, ±45° phase shift and delay-matching circuit 420 can include ILO 410-R and demultiplexer 412-R that are replicas of ILO 410 and demultiplexer 412, respectively. Demultiplexer 412-R can receive input clock signal 406 and generate an injection signal that is injected at both the in-phase and the quadrature-phase injection points of ILO 410-R. Specifically, injection point select signal 438 can be provided to demultiplexer 412-R which causes demultiplexer 412-R to inject the injection clock signal into both the in-phase and the quadrature-phase injection points of ILO 410-R. ILO 410-R can be provided a free-running frequency control signal 436 so that the free-running frequency of ILO 410-R is equal to the frequency of the injection clock signal (which is equal to the frequency of input clock signal 406), Δω=0 for ILO 410-R. Demultiplexer 412-R and ILO 410-R introduce a delay that matches the delay introduced by demultiplexer 412 and ILO 410 because demultiplexer 412-R and ILO 410-R are replicas of demultiplexer 412 and ILO 410, respectively. Under these conditions (i.e., when the signal is injected simultaneously at in-phase and quadrature-phase injection points, Δω=0, and delays of ILOs 410-R and 412-R match delays of ILOs 410 and 412, respectively), ILO 410-R produces an output signal whose phase corresponds to point "E" in FIG. 3C. The output of ILO 410-R can now be used as a reference for calibrating the phase boundaries of ILO 410.

Figure 4C:
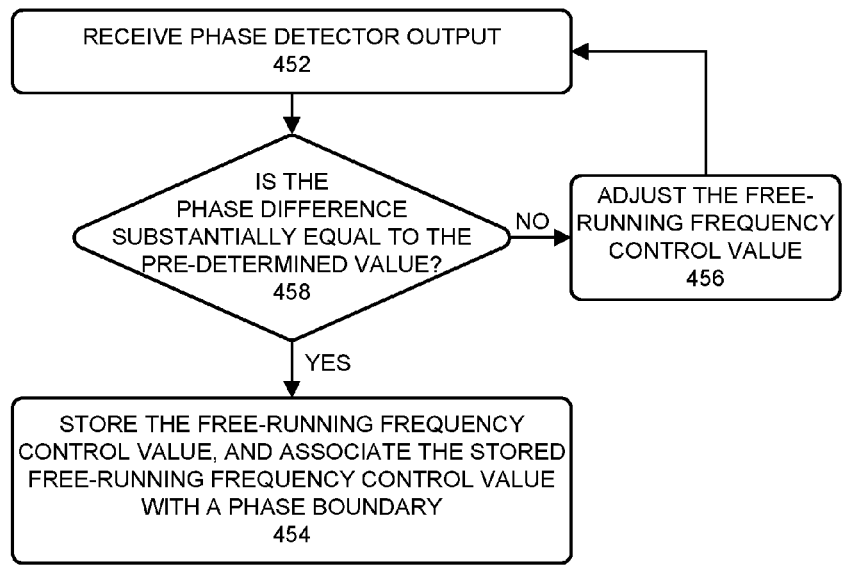
FIG. 4C presents a flowchart that illustrates a process for calibrating an ILO-based clock deskew circuit in accordance with some embodiments described in this disclosure.

FIG. 4C presents a flowchart that illustrates a process for calibrating an ILO-based clock deskew circuit in accordance with some embodiments described in this disclosure.

The process can begin by a calibration system (e.g., calibration logic 426) receiving phase detector output (operation 452). The phase detector output (e.g., phase detector output 424) can indicate a phase difference between the output of a first ILO (e.g., ILO 410) and the output of a second ILO (e.g., ILO 410-R). The calibration system can provide a free-running frequency control value to one or both of the ILOs. Specifically, in some embodiments, the calibration system can select one of the ILOs to be an active ILO, and the other to be a reference ILO. Next, the calibration system can select an injection point (e.g., injection point "I" or "Q") for calibration. The calibration system can then set the free-running frequency of one of the ILOs (e.g., the reference ILO) to be equal to the frequency of the input clock signal, and sweep the free-running frequency of the other ILO (e.g., the active ILO). For a given free-running frequency control value, the calibration system can determine whether the difference between the phases of the two ILOs is substantially equal to a pre-determined value (operation 458). For example, in embodiments that use a zero-phase detector, the pre-determined value can be zero, whereas in embodiments that use an XOR-based phase detector, the pre-determined value can be +90° or −90°. In some embodiments, the calibration system can determine that the difference between the phases of the two ILOs is substantially equal to the pre-determined value when the calibration system detects a sign change in the phase detector output as the free-running frequency of the active ILO is swept. If the difference between the two phases is not substantially equal to the pre-determined value, the system can adjust the free-running frequency control value (operation 456). On the other hand, if the difference between the phases is substantially equal to the pre-determined value, the calibration system can store the free-running frequency control value and associate the stored free-running frequency control value with a phase boundary (operation 454).

Figure 5A:
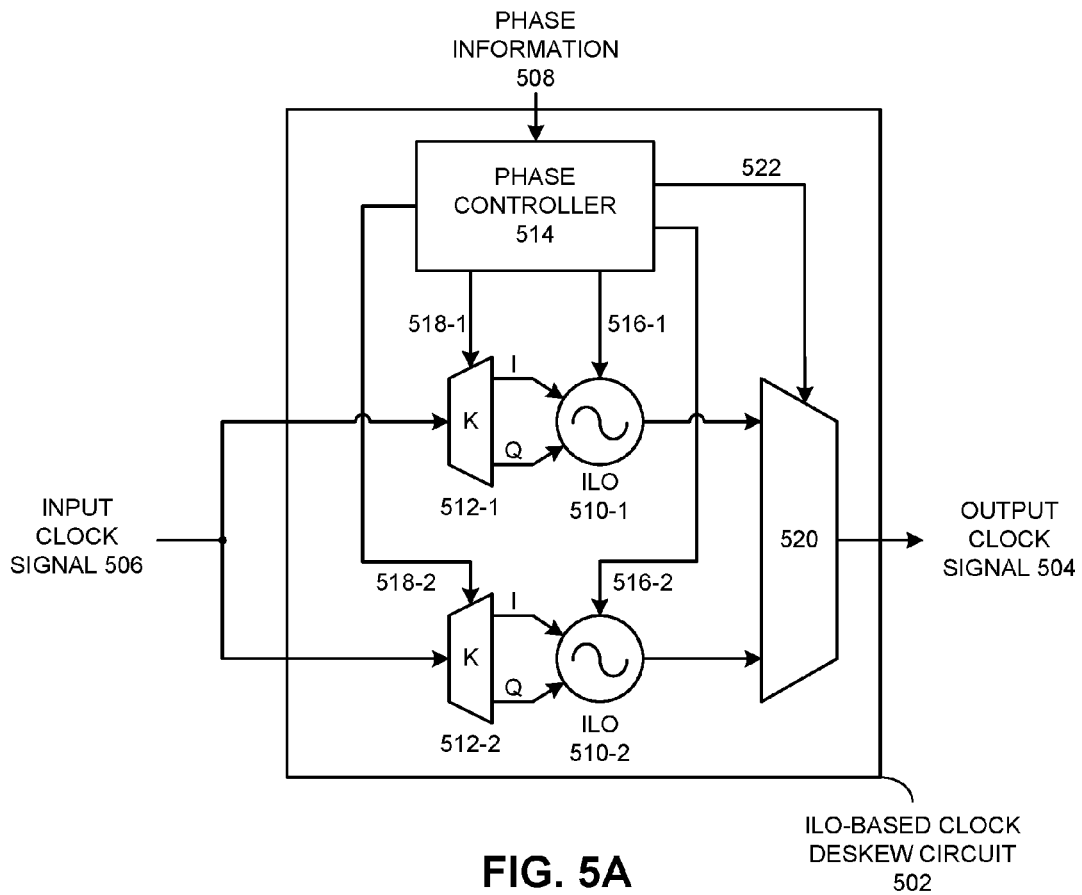
FIG. 5A illustrates an ILO-based clock deskew circuit in accordance with some embodiments described in this disclosure.

FIG. 5A illustrates an ILO-based clock deskew circuit in accordance with some embodiments described in this disclosure.

ILO-based clock deskew circuit 502 can include phase controller 514, demultiplexers 512-1 and 512-2, ILOs 510-1 and 510-2, and multiplexer 520. Input clock signal 506 can be provided as input to demultiplexers 512-1 and 512-2. Demultiplexers 512-1 and 512-2 can receive injection point select signals 518-1 and 518-2, respectively. Demultiplexers 512-1 and 512-2 can inject an injection clock signal into ILOs 510-1 and 510-2, respectively, based on the injection point select signals received by the demultiplexers. Demultiplexer 512-1 and 512-2 can also adjust the amplitude of the injection clock signal (shown in FIG. 5A as gain "K").

ILOs 510-1 and 510-2 can receive free-running frequency control signals 516-1 and 516-2, respectively. The outputs of ILOs 510-1 and 510-2 can be provided as inputs to multiplexer 520. Based on ILO output select signal 522, multiplexer 520 can select the output of ILO 510-1 or the output of ILO 510-2 as output clock signal 504. Phase controller 514 can receive phase information 508. Phase controller 514 can generate, based on phase information 508, injection point select signals 518-1 and 518-2, free-running frequency control signals 516-1 and 516-2, and ILO output select signal 522.

Figure 5B:
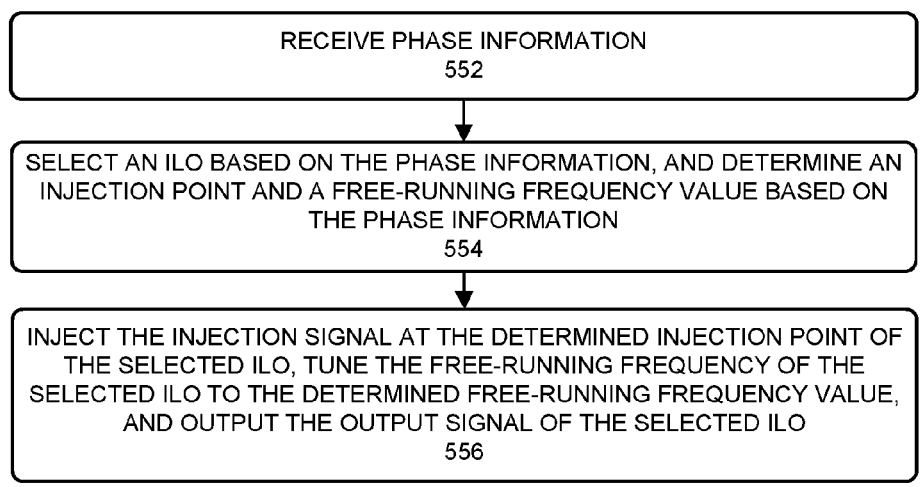
FIG. 5B presents a flowchart that illustrates a process for modifying the phase of a clock signal using an ILO-based clock deskew circuit in accordance with some embodiments described in this disclosure.

FIG. 5B presents a flowchart that illustrates a process for modifying the phase of a clock signal using an ILO-based clock deskew circuit, e.g., ILO-based clock deskew circuit 502, in accordance with some embodiments described in this disclosure.

In some embodiments, an ILO-based clock deskew circuit can receive phase information (operation 552). The phase information can indicate a target phase setting for the output clock signal of the ILO. Next, the ILO-based clock deskew circuit can select an ILO based on the phase information, and determine an injection point and a free-running frequency value based on the phase information (operation 554).

The ILO-based clock deskew circuit can then inject the injection clock signal at the determined injection point in the selected ILO, tune the free-running frequency of the selected ILO to the determined free-running frequency value, and output the output signal of the selected ILO (operation 556).

Specifically, in some embodiments, phase controller 514 can select an ILO by selecting the ILO's output signal using ILO output select signal 522, and generate injection point select signals 518-1 and 518-2 and free-running frequency control signals 516-1 and 516-2 based on phase information 508. Phase controller 514 can use injection point select signals 518-1 and 518-2 to inject the injection clock signal at a particular injection point in ILOs 510-1 and 510-2, respectively. Phase controller 514 can use free-running frequency control signals 516-1 and 516-2 to tune the free-running frequencies of ILOs 510-1 and 510-2, respectively.

In some embodiments, an ILO-based clock deskew circuit can use one of the ILOs for in-phase injection and the other for quadrature-phase injection. For example, suppose ILO-based clock deskew circuit 502 uses ILO 510-1 for in-phase injection and ILO 510-2 for quadrature-phase injection. Now, given a phase value, phase controller 514 can determine whether generating the phase requires in-phase injection or quadrature-phase injection. If the phase is to be generated using in-phase injection, phase controller 514 can use injection point select signal 518-1 to select in-phase injection for ILO 510-1, provide an appropriate free-running frequency control signal 516-1 to ILO 510-1, and use ILO output select signal 522 to select the output of ILO 510-1. On the other hand, if the phase is to be generated using quadrature-phase injection, phase controller 514 can use injection point select signal 518-2 to select quadrature-phase injection for ILO 510-2, provide an appropriate free-running frequency control signal 516-2 to ILO 510-2, and use ILO output select signal 522 to select the output of ILO 510-2.

Figure 6A:
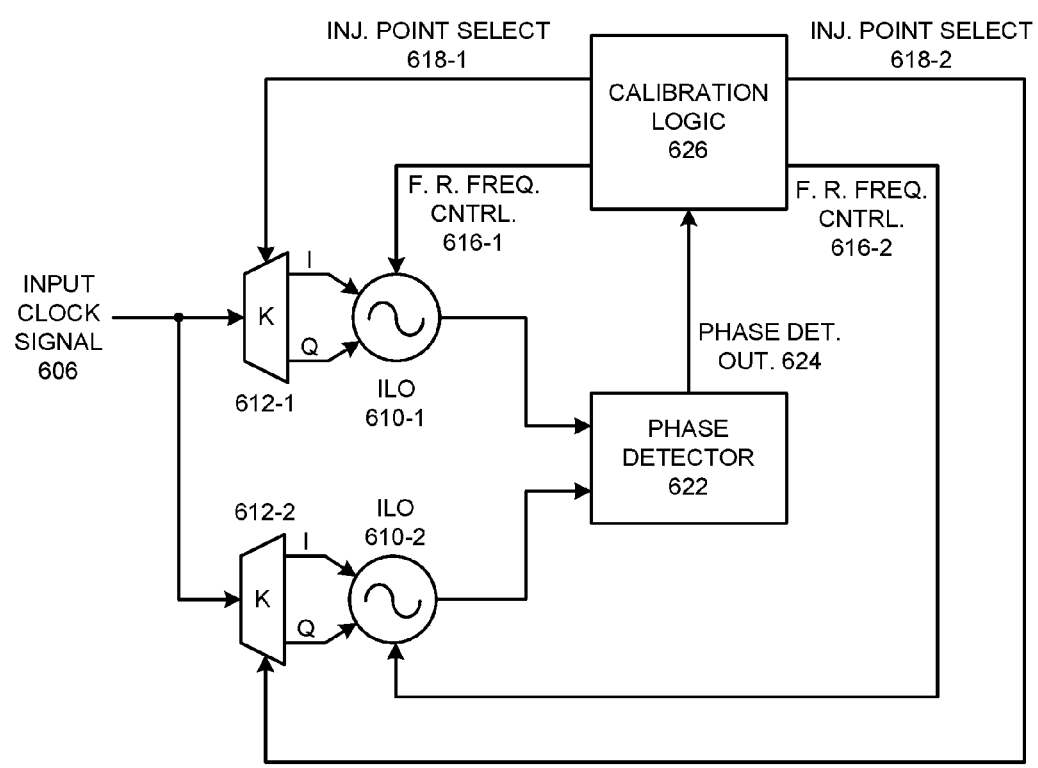
FIG. 6A illustrates how an ILO-based clock deskew circuit can be calibrated in accordance with some embodiments described in this disclosure.

FIG. 6A illustrates how an ILO-based clock deskew circuit can be calibrated in accordance with some embodiments described in this disclosure.

In some embodiments, input clock signal 606 can be provided as input to demultiplexers 612-1 and 612-2. Demultiplexers 612-1 and 612-2 can receive injection point select signals 618-1 and 618-2, respectively. Demultiplexers 612-1 and 612-2 can inject an injection clock signal into ILOs 610-1 and 610-2, respectively, based on the injection point select signals received by the demultiplexers. ILOs 610-1 and 610-2 can receive free-running frequency control signals 616-1 and 616-2, respectively. The outputs of ILOs 610-1 and 610-2 can be provided as inputs to phase detector 622. Phase detector 622 can generate phase detector output 624, which can be indicative of the phase difference between the two inputs, namely, the phase difference between the outputs of ILOs 610-1 and 610-2.

Calibration logic 626 can be used to calibrate the ILO-based clock deskew circuit by determining frequency difference values (e.g., $\Delta\omega min$ and $\Delta\omega max$) that correspond to the phase boundaries associated with the injection points. In some embodiments, calibration logic 626 can receive phase detector output 624 and generate injection point select signals 618-1 and 618-2, and free-running frequency control signals 616-1 and 616-2. Calibration logic 626 can set the injection point select signals 618-1 and 618-2 to select two adjacent phase ranges for the two ILOs, such as in-phase and quadrature phase, respectively. Calibration logic 626 can then sweep the free-running frequency control signals 616-1 and 616-2 in opposite directions starting from the input clock frequency (that is, from $\Delta\omega=0$ for both ILOs) to determine the free-running frequency signal values that correspond to the switchover point between the two phase ranges. Specifically, in some embodiments, calibration logic 626 can sweep the free-running frequency control signals 616-1 and 616-2 until the phase of the output of ILO 610-1 is substantially equal to the phase of the output of ILO 610-2. For example, if ILO 610-1 has the injection point selected as "I" and ILO 610-2 has the injection point selected as "Q", and free-running frequency control signal 616-1 is swept in the negative direction (e.g., from point "F" to point "B" in FIG. 3C) while free-running frequency control signal 616-2 is swept in the positive direction (e.g., from point "G" to point "C" in FIG. 3C), then the two ILO output phases may be equal when ILOs 610-1 and 610-2 are operating at switchover points "B" and "C" in FIG. 3C, respectively. In this manner, calibration logic 626 can determine frequency difference values (e.g., $\Delta\omega$min and $\Delta\omega$max) that correspond to the phase boundaries associated with the injection points. In some embodiments, calibration logic 626 can be part of a phase controller, e.g., phase controller 514 shown in FIG. 5A.

The phase tuning curves in FIG. 3C are shown as being symmetric with respect to positive and negative adjustment of the free-running frequency control offset $\Delta\omega$. However, in some embodiments the curves may not be symmetric. In such embodiments, when the free-running frequencies of the two ILOs are swept in opposite directions, the phases of the two ILOs may be equal at a non-zero phase value, i.e., at a phase that is earlier or later than 0°. However, even in such embodiments, calibration logic 626 can successfully determine free-running frequency control values $\Delta\omega$min and $\Delta\omega$max that correspond to the switchover points.

Figure 6B:
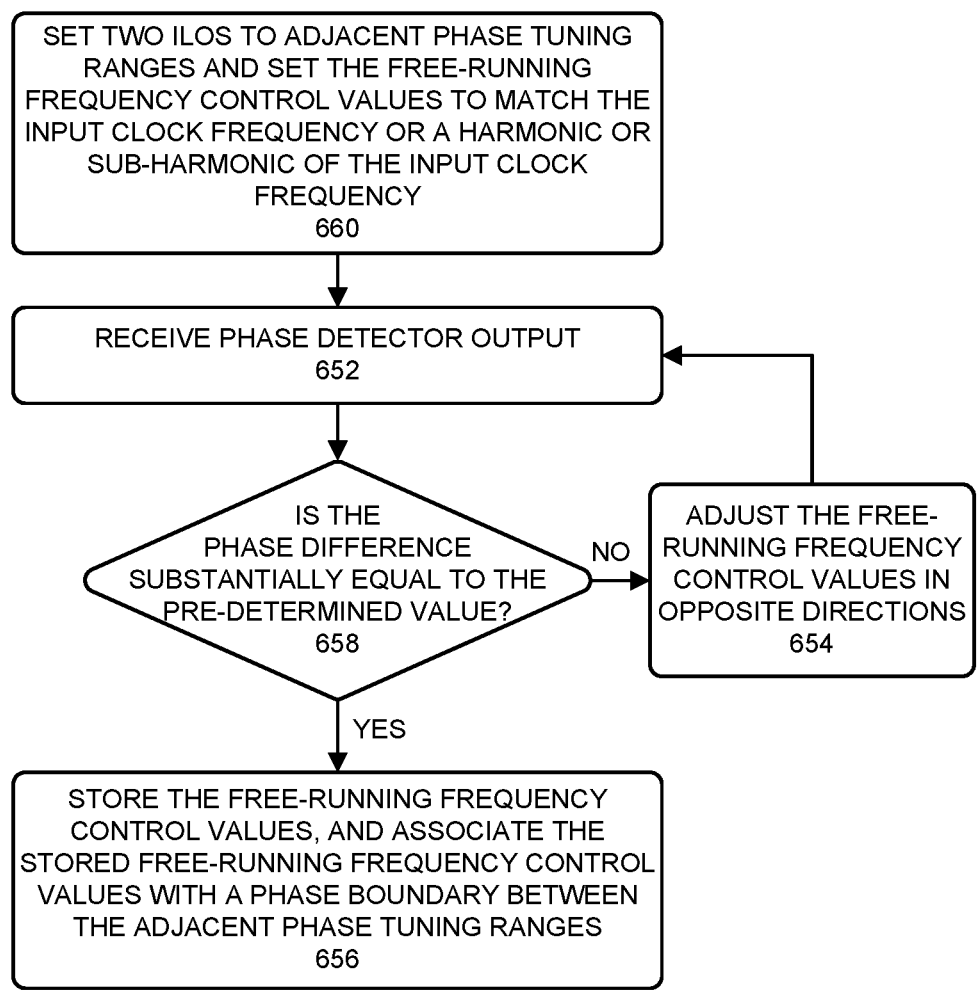
FIG. 6B presents a flowchart that illustrates a process for calibrating an ILO-based clock deskew circuit in accordance with some embodiments described in this disclosure.

FIG. 6B presents a flowchart that illustrates a process for calibrating an ILO-based clock deskew circuit in accordance with some embodiments described in this disclosure.

The process can begin with a calibration system (e.g., calibration logic 626) setting two ILOs to adjacent phase tuning ranges and setting the free-running frequencies of the two ILOs to match the input clock frequency or a harmonic or sub-harmonic of the input clock frequency (operation 660). Next, the calibration system can receive phase detector output (operation 652). The phase detector output (e.g., phase detector output 624) can indicate a phase difference between the outputs of the two ILOs (e.g., ILOs 610-1 and 610-2).

The calibration system can then sweep the free-running frequencies of the two ILOs in opposite directions until the phases of the outputs of the two ILOs are substantially equal. In some embodiments, the calibration system can iteratively adjust the free-running frequencies of the two ILOs, and check the phase detector output 624 to determine whether the difference between the two phases is substantially equal to a pre-determined value (operation 658). For example, in embodiments that use a zero-phase detector, the pre-determined value can be zero, whereas in embodiments that use an XOR-based phase detector, the pre-determined value can be +90° or −90°. In some embodiments, the calibration system can determine that the phases of the two ILOs are substantially equal when the calibration system detects a sign change in the phase detector output.

If the difference between the two phases is not substantially equal to the pre-determined value, the system can adjust the free-running frequency control values in opposite directions (operation 654). On the other hand, if the difference between the two phases is substantially equal to the pre-determined value, the calibration system can store the free-running frequency control values (for example, in register circuits) and associate the stored free-running frequency control values with a phase boundary between the adjacent phase tuning ranges (operation 656). In some embodiments, the system can determine a free-running frequency control value that corresponds to a given phase of the output clock signal by interpolating between the stored free-running frequency control values.

For example, in FIG. 3C, the calibration system can move the operating point of ILO 610-1 along the top curve from the midpoint (i.e., the operating point that corresponds to $\Delta\omega=0$) to point "B," and move the operating point of ILO 610-2 along the bottom curve from the midpoint to point "C." Note that the output phases of ILOs 610-1 and 610-2 will be substantially equal when ILOs 610-1 and 610-2 simultaneously reach operating points "B" and "C," respectively. When this happens, the calibration system can store the free-running frequency control values corresponding to points "B" and "C," and use these free-running frequency control values for switching between in-phase injection and quadrature-phase injection. In an embodiment, a register circuit is used to store the free-running frequency control values corresponding to points "B" and "C."

In some embodiments, the ILO-based clock deskew circuit can include more than two phase tuning ranges. For example, each ILO in an ILO-based clock deskew circuit can have n injection points denoted by $p_0, p_1, \ldots p_{n-1}$ that correspond to n phase tuning ranges $R_0, R_1, \ldots R_{n-1}$, that are centered at phases $\theta_0, \theta_1, \ldots \theta_{n-1}$. Some of the n injection points may correspond to the same injection node in the ILO circuit, but with opposite phase. For example, injection at an in-phase oscillator node with either positive or negative injection amplitude may be generally be considered as two different injection points, because they correspond to two distinct injection selections with distinct phase tuning ranges and center phases.

In embodiments that are similar to the embodiments illustrated in FIGS. 3A-3C and FIGS. 4A-4C, the ILO-based clock deskew circuit can determine an injection point from the n injection points and a free-running frequency value based on the target phase value. Next, the ILO-based clock deskew circuit can inject the injection signal at the determined injection point and tune the ILO to the determined free-running frequency value.

To calibrate the boundary between the adjacent phase tuning ranges $R_k$ and $R_{k+1}$, the calibration logic can simultaneously inject the injection signal into injection points $p_k$ and $p_{k+1}$ of the replica ILO, and sweep the free-running frequency of the active ILO until the phase difference between phases of the replica ILO and the active ILO is substantially equal to a pre-determined value. For example, the calibration logic can simultaneously inject the injection signal into injection points $p_k$ and $p_{k+1}$ of the replica ILO, and sweep the free-running frequency of the active ILO until the phases of the replica ILO and the active ILO are substantially equal (i.e., the phase difference between the replica ILO and the active ILO is nominally zero). Once the free-running frequency control signal values for the phase boundaries have been determined, the ILO-based clock deskew circuit can generate an output clock signal with a given target phase by determining an injection point and a free-running frequency control signal value.

In embodiments that are similar to the embodiments illustrated in FIGS. 5A-5B and FIGS. 6A-6B, the ILO-based clock deskew circuit can use the two ILOs in an alternating fashion. For example, the ILO-based clock deskew circuit can use one of the ILOs for odd numbered phase tuning ranges (e.g., phase tuning ranges $R_1, R_3, R_5$, etc.) and the other for even numbered phase tuning ranges (e.g., phase tuning ranges $R_0, R_2, R_4$, etc.). Given a target phase value, the ILO-based clock deskew circuit can select an ILO and determine an injection point from the n injection points and a free-running frequency value. Next, the ILO-based clock deskew circuit can inject the injection signal at the determined injection point of the selected ILO and tune the selected ILO to the determined free-running frequency value.

Some embodiments may use calibration logic to calibrate the phase boundaries, and use the calibrated phase boundaries to switch between the two ILOs. Specifically, to calibrate the boundary between the adjacent phase tuning ranges $R_k$ and $R_{k+1}$, the calibration logic can inject an injection signal at injection point $p_k$ in one of the ILOs and inject the injection signal at injection point $p_{k+1}$ in the other ILO. The calibration logic can then concurrently sweep the free-running frequencies of the two ILOs in opposite directions until the phases of their output signals are substantially equal to each other. Once the free-running frequency control signal values for the phase boundaries have been determined, the ILO-based clock deskew circuit can generate an output clock signal with a given target phase by selecting an ILO and by determining an injection point and a free-running frequency control signal value. Some embodiments may not need to calibrate the phase boundaries beforehand. Specifically, these embodiments may switch between the two ILOs when the phases of the two ILOs match.

Figure 7A:
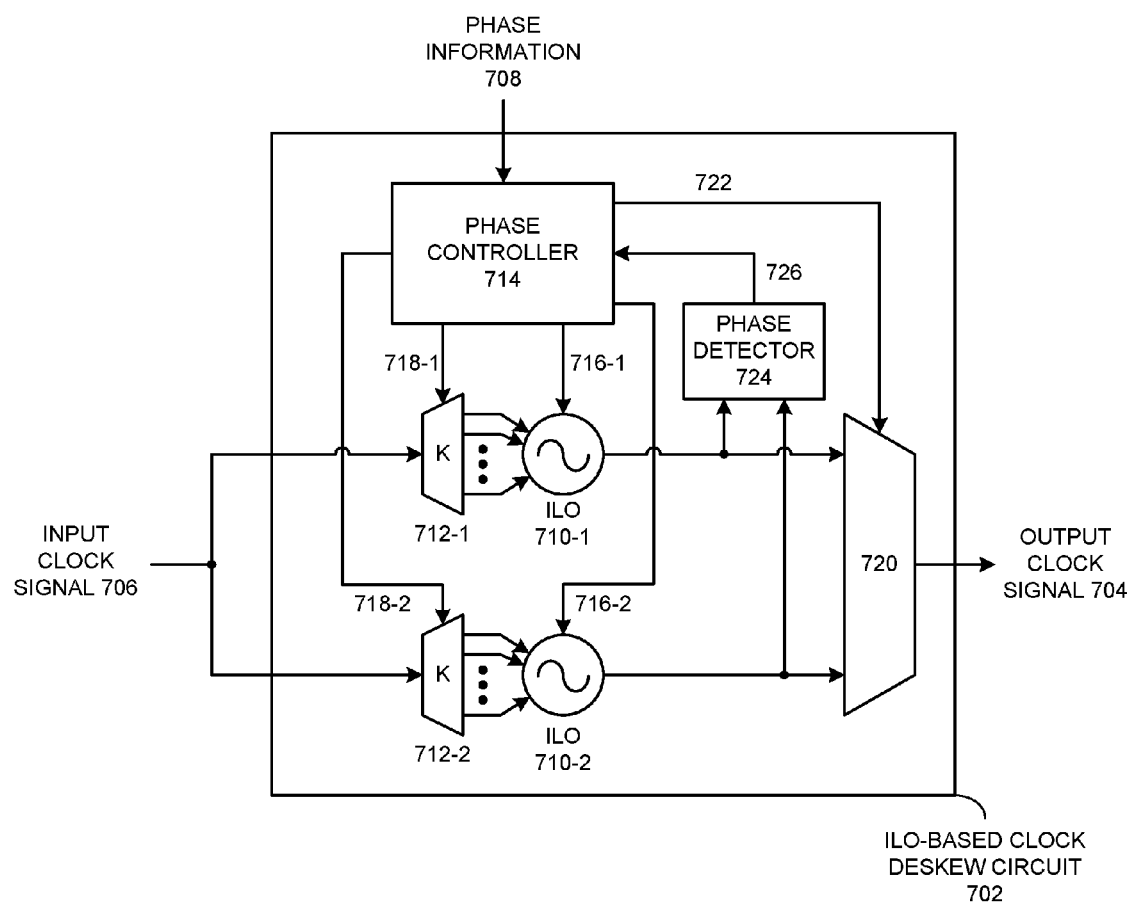
FIG. 7A illustrates an ILO-based clock deskew circuit in accordance with some embodiments described in this disclosure.

FIG. 7A illustrates an ILO-based clock deskew circuit in accordance with some embodiments described in this disclosure.

ILO-based clock deskew circuit 702 can include phase controller 714, demultiplexers 712-1 and 712-2, ILOs 710-1 and 710-2, and multiplexer 720. ILOs 710-2 and 710-2 can have two or more injection points. Input clock signal 706 can be provided as input to demultiplexers 712-1 and 712-2. Demultiplexers 712-1 and 712-2 can receive injection point select signals 718-1 and 718-2, respectively, to select an injection point from the two or more injection points. Demultiplexers 712-1 and 712-2 can inject an injection clock signal into ILOs 710-1 and 710-2, respectively, based on the injection point select signals received by the demultiplexers. Demultiplexer 712-1 and 712-2 can also adjust the amplitude of the injection clock signal (shown in FIG. 7A as gain "K").

ILOs 710-1 and 710-2 can receive free-running frequency control signals 716-1 and 716-2, respectively. The outputs of ILOs 710-1 and 710-2 can be provided as inputs to multiplexer 720. Based on ILO output select signal 722, multiplexer 720 can select the output of ILO 710-1 or the output of ILO 710-2 as output clock signal 704. Phase controller 714 can receive phase information 708. Phase controller 714 can generate, based on phase information 708, injection point select signals 718-1 and 718-2, free-running frequency control signals 716-1 and 716-2, and ILO output select signal 722.

The outputs of ILOs 710-1 and 710-2 can be provided as inputs to phase detector 724. Phase detector 724 can generate phase detector output 726, which can be indicative of the phase difference between the two inputs, namely, the phase difference between the outputs of ILOs 710-1 and 710-2. Phase detector output 726 can then be provided as an input to phase controller 714, which can use phase detector output 726 to determine when to switch between injection points.

In some embodiments, ILO-based clock deskew circuit 702 can use ILOs 710-1 and 710-2 in an alternating fashion while calibrating or detecting the phase boundaries between adjacent phase tuning ranges as the target phase is adjusted.

Figures 7B, 8:
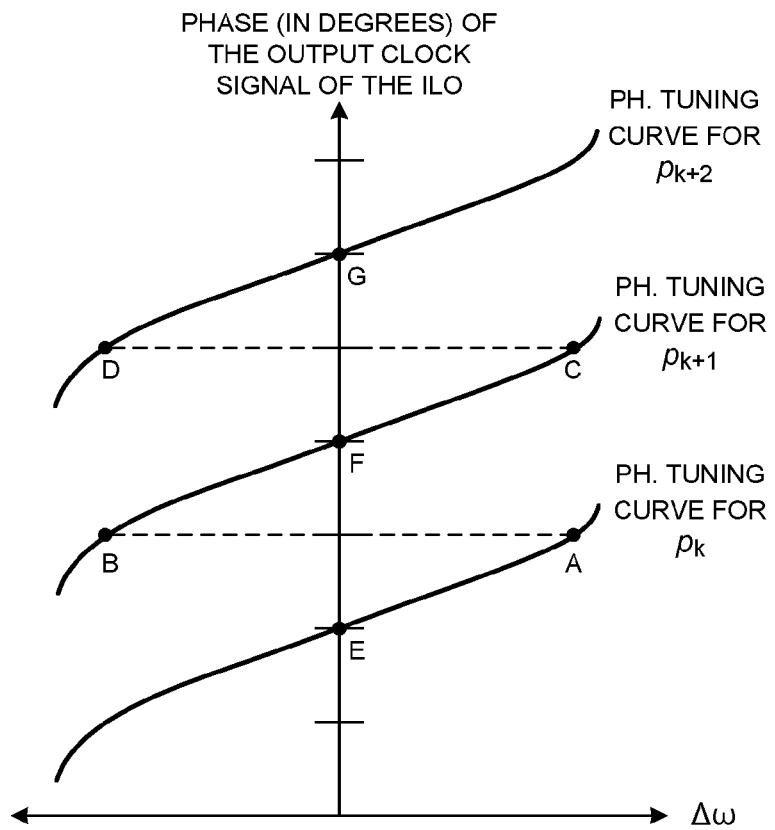
FIG. 7B illustrates phase tuning curves for three successive injection points in accordance with some embodiments described in this disclosure.
FIG. 8 illustrates a memory controller that includes an ILO-based clock deskew circuit in accordance with some embodiments described in this disclosure.

FIG. 7B illustrates phase tuning curves for three successive injection points $p_k$, $p_{k+1}$, and $p_{k+2}$ in accordance with some embodiments described in this disclosure. For example, with ILOs capable of receiving injection signals at in-phase and quadrature-phase injection points with positive or negative amplitude, these three curves might correspond to injection points "+Q" (quadrature-phase injection), "+I" (in-phase injection), and "−Q" (quadrature-phase injection with inversion), respectively.

Consider the case where the active ILO (e.g., ILO 710-1), whose output is selected by multiplexer 720 as the output clock signal, is configured to operate with injection at injection point $p_k$ and with positive free-running frequency offset $\Delta\omega$. In this case, the phase controller 714 may configure the reference ILO (e.g., ILO 710-2), whose output is not selected by multiplexer 720, with injection at injection point $p_{k+1}$ and negative free-running frequency offset $-\Delta\omega$. As phase controller 714 increases the output phase by increasing $\Delta\omega$ on the active ILO, it simultaneously decreases $-\Delta\omega$ on the reference ILO, thereby moving the phase of active ILO from point "E" towards point "A" and moving the phase of reference ILO from point "F" towards point "B."

When the ILOs reach points "A" and "B," they have the same phase. When this condition is detected by phase detector 724, phase controller 714 (which receives phase detector output 726) switches the output selection multiplexer 720 so that the reference ILO injecting at injection point $p_{k+1}$ is now the active ILO, and the active ILO injecting at injection point $p_{k+1}$ is now the reference ILO. The phase controller can continue to increase the output clock phase by increasing $\Delta\omega$ on the now active ILO injecting at injection point $p_{k+1}$. In some embodiments, as long as the active free-running frequency offset $\Delta\omega$ is negative, the reference ILO continues to inject at injection point $p_k$. In these embodiments, as the negative $\Delta\omega$ moves closer to zero, the phase of the active ILO may move from point "B" to point "F," and the phase of the reference ILO may move from point "A" to point "E."

In some embodiments, if phase controller 714 increases the active ILO free-running frequency offset $\Delta\omega$ to be positive, it then switches the reference ILO to stop injecting at injection point $p_k$ and start injecting at injection point $p_{k+2}$. As phase controller 714 continues to increase the output clock phase by increasing the now positive $\Delta\omega$ value on the active ILO (which is injecting at injection point $p_{k+1}$), it simultaneously decreases the negative $\Delta\omega$ value on the reference ILO (which is injecting at injection point $p_{k+2}$), thereby moving the phase of active ILO from point "F" towards point "C" and moving the phase of reference ILO from point "G" towards point "D." As the two ILO phases reach points "C" and "D," the active and reference ILOs again switch responsibility.

A similar process can occur when phase controller 714 decreases the output clock phase, with the steps outlined above occurring in reverse direction and order. Note that whenever the active ILO free-running frequency offset is positive, the reference ILO can be operated with negative free-running frequency offset at the succeeding injection point corresponding to an adjacent advanced phase range, which is the phase range that will be needed when $\Delta\omega$ increases past the upper control boundary (e.g., $\Delta\omega$max). Similarly, whenever the active ILO free-running frequency offset is negative, the reference ILO can be operated with positive free-running frequency offset at the preceding injection point corresponding to an adjacent retarded phase range, which is the phase range that will be needed when $\Delta\omega$ decreases below the lower control boundary (e.g., $\Delta\omega$min).

FIG. 8 illustrates a memory controller that includes an ILO-based clock deskew circuit in accordance with some embodiments described in this disclosure.

Memory controller 800 may be coupled with memory module 804 via one or more signal lines, which may carry control signals, clock signals, and/or data signals. In an embodiment, memory module 804 includes one or more memory devices having arrays of memory cells. Examples of memory devices include dynamic random access memory (DRAM) devices such as synchronous double data rate (DDR) DRAM or non volatile memory such as Flash memory. In some embodiments, memory controller 800 is an integrated circuit device having an interface that orchestrates data flow to and from a memory device. In various embodiments, memory controller 800 is disposed, along with one or more memory devices, on a circuit board, or may reside with the memory device in a common encapsulated package, or included in a stack configuration with the memory device (for example, in a package on package (PoP) configuration or using through silicon via (TSV) technology).

Memory controller 800 may include one or more ILO-based clock deskew circuits, such as ILO-based clock deskew circuit 802. In some embodiments, memory controller 800 may use ILO-based clock deskew circuit 802 to adjust the phase of a clock signal. For example, memory controller 800 may use ILO-based clock deskew circuit 802 to adjust the phase of a clock signal that is used for communicating between memory controller 800 and a memory device disposed on memory module 804.

Any data structures and/or code described in this disclosure can be stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and/or processes described in this disclosure can be embodied as code and/or data, which can be stored in a computer-readable storage medium as described above. When a computer system reads and executes the code and/or data stored on the computer-readable storage medium, the computer system performs the methods and/or processes.

The methods and/or processes described in this disclosure can also be embodied in hardware. Hardware embodiments include, but are not limited to, application-specific integrated circuit (ASIC) chips, field-programmable gate arrays (FPGAs), and other programmable-logic devices now known or later developed. For example, the memory controller 800 shown in FIG. 8 may be a processor (e.g., with multiple processor cores), a system-on-chip (SoC), an ASIC, a graphics processing unit (GPU), a mobile applications processors, an FPGA, etc. It should also be noted that the use of the ILO based methods and apparatuses described herein are not limited to the functionality of the signaling interface of a memory controller. Specifically, the ILO based methods and apparatuses described herein may be used in the above mentioned chips for other applications or purposes, such as other types of signaling interfaces or clocking where deskewing or generation of a clock signal may be desired.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit (IC), comprising:
   at least one injection-locked oscillator (ILO), wherein the ILO has multiple injection points, and a free-running frequency that that can be modified by using a control signal;
   an injection circuit to inject an injection signal into an injection point of the ILO based on a selection signal; and
   a phase controller circuit to (1) determine an injection point and a free-running frequency based on a target phase difference with respect to a reference phase, (2) generate and provide the selection signal to the injection circuit based on the determined injection point, and (3) generate and provide the control signal to the ILO based on the determined free-running frequency.

2. The IC of claim 1, wherein the phase controller determines the injection point by (1) determining a phase tuning range that includes the target phase difference, and (2) determining the injection point that corresponds to the determined phase tuning range.

3. The IC of claim 2, wherein the phase controller determines the free-running frequency based on a difference between a boundary of the determined phase tuning range and the target phase difference.

4. The IC of claim 1, wherein the phase controller generates the control signal based on a set of control values, wherein each control value corresponds to a phase boundary between two adjacent phase tuning ranges of the ILO.

5. The IC of claim 4, further comprising calibration circuitry to determine the set of control values.

6. The IC of claim 1, wherein the ILO is based on a ring oscillator.

7. The IC of claim 1, wherein the ILO is based on a tank circuit.

8. A controller device that controls the operation of a memory device, the controller device comprising:
   at least one injection-locked oscillator (ILO), wherein the ILO has multiple injection points, and a free-running frequency that can be modified by using a control signal;
   an injection circuit to inject an injection signal into an injection point of the ILO based on a selection signal, wherein the injection signal is based on an input clock signal; and
   a phase controller circuit to (1) determine an injection point and a free-running frequency based on a target phase difference with respect to a reference phase, (2) generate and provide the selection signal to the injection circuit based on the determined injection point, and (3) generate and provide the control signal to the ILO based on the determined free-running frequency.

9. The controller device of claim 8, wherein the phase controller determines the injection point by (1) determining a phase tuning range that includes the target phase difference, and (2) determining the injection point that corresponds to the determined phase tuning range.

10. The controller device of claim 9, wherein the phase controller determines the free-running frequency based on a difference between a boundary of the determined phase tuning range and the target phase difference.

11. The controller device of claim 8, wherein the phase controller generates the control signal based on a set of control values, wherein each control value corresponds to a phase boundary between two adjacent phase tuning ranges of the ILO.

12. The controller device of claim 11, further comprising calibration circuitry to determine the set of control values.

13. The controller device of claim 8, wherein the ILO is based on a ring oscillator.

14. The controller device of claim 8, wherein the ILO is based on a tank circuit.

15. A method, comprising:
   determining an injection point of an injection-locked oscillator (ILO) and a free-running frequency of the ILO based on a target phase difference with respect to a reference phase, wherein the ILO has multiple injection points, and wherein the free-running frequency of the ILO can be modified by using a control signal;
   generating and providing a selection signal to an injection circuit based on the determined injection point, wherein the injection circuit injects an injection signal into the determined injection point of the ILO based on the selection signal; and
   generating and providing the control signal to the ILO based on the determined free-running frequency.

16. The method of claim 15, wherein determining the injection point comprises: (1) determining a phase tuning range that includes the target phase difference, and (2) determining the injection point that corresponds to the determined phase tuning range.

17. The method of claim 16, wherein the free-running frequency is determined based on a difference between a boundary of the determined phase tuning range and the target phase difference.

18. The method of claim 15, wherein the control signal is generated based on a set of control values, wherein each control value corresponds to a phase boundary between two adjacent phase tuning ranges of the ILO.

19. The method of claim 15, wherein the ILO is based on a ring oscillator.

20. The method of claim 15, wherein the ILO is based on a tank circuit.

* * * * *